United States Patent
Masaoka

(10) Patent No.: US 11,198,626 B2
(45) Date of Patent: Dec. 14, 2021

(54) APPARATUS FOR PRODUCING CONDITIONED WATER

(71) Applicant: KURITA WATER INDUSTRIES LTD., Tokyo (JP)

(72) Inventor: Tooru Masaoka, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 150 days.

(21) Appl. No.: 16/497,976

(22) PCT Filed: Sep. 12, 2017

(86) PCT No.: PCT/JP2017/032800
§ 371 (c)(1),
(2) Date: Sep. 26, 2019

(87) PCT Pub. No.: WO2018/179495
PCT Pub. Date: Oct. 4, 2018

(65) Prior Publication Data
US 2020/0317547 A1 Oct. 8, 2020

(30) Foreign Application Priority Data
Mar. 30, 2017 (JP) .............................. JP2017-068092

(51) Int. Cl.
*C02F 1/66* (2006.01)
*C02F 1/20* (2006.01)
(Continued)

(52) U.S. Cl.
CPC ............ *C02F 1/66* (2013.01); *B01D 19/0042* (2013.01); *B01D 19/0063* (2013.01); *B01F 5/10* (2013.01);
(Continued)

(58) Field of Classification Search
CPC ...... C02F 1/66; C02F 1/20; C02F 1/68; C02F 2103/04; C02F 2103/346; C02F 2209/40;
(Continued)

(56) References Cited

U.S. PATENT DOCUMENTS 6,290,777 B1 * 9/2001 Imaoka .................... B08B 3/08
134/1
6,416,586 B1 * 7/2002 Ohmi ....................... B08B 3/08
134/1
(Continued)

FOREIGN PATENT DOCUMENTS

CN 101031787 A 9/2007
CN 102007579 A 4/2011
(Continued)

OTHER PUBLICATIONS

PCT/ISA/210, "International Search Report for International Application No. PCT/JP2017/032800," dated Dec. 5, 2017.
(Continued)

*Primary Examiner* — Joseph W Drodge
(74) *Attorney, Agent, or Firm* — Manabu Kanesaka

(57) ABSTRACT

An apparatus for producing conditioned water configured to add a pH adjuster and/or a redox potential regulator to ultrapure water to produce conditioned water, the generator including: a chemical tank configured to store a chemical solution containing the pH adjuster and/or the redox potential regulator; a chemical injection pipe configured to inject the chemical solution in the chemical tank into the ultrapure water; and a degassing device configured to degas the chemical solution injected into the ultrapure water. When producing conditioned water useful as wash water for semiconductor wafers by adding a pH adjuster and/or a redox potential regulator into ultrapure water, the present invention can solve problems such as incorporation of DO from the chemical solution, injection failure and measurement failure
(Continued)

of the flow meter due to foaming of the chemical solution, thereby enabling stable production of conditioned water with a low DO concentration and high water quality.

8 Claims, 3 Drawing Sheets

(51) Int. Cl.
| | |
|---|---|
| *C02F 1/68* | (2006.01) |
| *B01D 19/00* | (2006.01) |
| *B01F 5/10* | (2006.01) |
| *B01F 15/00* | (2006.01) |
| *H01L 21/02* | (2006.01) |
| *C02F 1/00* | (2006.01) |
| *C02F 103/04* | (2006.01) |
| *C02F 103/34* | (2006.01) |

(52) U.S. Cl.
CPC ........ *B01F 15/00136* (2013.01); *C02F 1/008* (2013.01); *C02F 1/20* (2013.01); *C02F 1/68* (2013.01); *C02F 2103/04* (2013.01); *C02F 2103/346* (2013.01); *C02F 2209/40* (2013.01); *C02F 2301/046* (2013.01); *C02F 2303/185* (2013.01); *H01L 21/02052* (2013.01)

(58) Field of Classification Search
CPC .......... C02F 2301/046; C02F 2303/185; C02F 1/686; C02F 2209/06; C02F 2209/04; C02F 1/685; C02F 1/70; C02F 1/72; C02F 1/722; C02F 9/00; C02F 2303/18; C02F 1/008; H01L 21/304; H01L 21/02052; B01D 19/00; B01D 19/0005; B01D 19/0036; B01D 19/0031; B01D 19/0042; B01D 19/0063; B01D 19/0068; B08B 3/10; B08B 3/12; B01F 5/10; B01F 15/00136; B01F 15/00142; B01F 15/00149
See application file for complete search history.

(56) References Cited

U.S. PATENT DOCUMENTS

| | | | |
|---|---|---|---|
| 7,329,312 B2 | 2/2008 | Morita et al. | |
| 8,999,069 B2 | 4/2015 | Ida et al. | |
| 10,138,149 B2 | 11/2018 | Yokoi et al. | |
| 2003/0094610 A1* | 5/2003 | Aoki .................. | C01B 3/00 257/48 |
| 2003/0132104 A1* | 7/2003 | Yamashita ............ | C02F 9/00 204/252 |
| 2005/0093182 A1* | 5/2005 | Morita ............ | B01F 15/0479 261/26 |
| 2008/0118418 A1 | 5/2008 | Morita | |
| 2009/0127201 A1* | 5/2009 | Kobayashi ............ | B01J 31/08 210/668 |
| 2010/0044311 A1* | 2/2010 | Kobayashi ............ | B01D 61/16 210/638 |
| 2011/0024361 A1* | 2/2011 | Schwartzel ......... | C02F 1/46109 210/739 |
| 2011/0042281 A1* | 2/2011 | Tokoshima ............ | C02F 1/68 210/96.1 |
| 2016/0233082 A1* | 8/2016 | Yano ................. | H01L 21/67086 |
| 2017/0044029 A1* | 2/2017 | Nakano ............... | B01D 61/58 |
| 2017/0327396 A1* | 11/2017 | Ikuno ................. | B01D 15/363 |
| 2020/0017384 A1* | 1/2020 | Fujimura .............. | C02F 1/20 |
| 2020/0048116 A1* | 2/2020 | Gan .................... | C02F 1/20 |

FOREIGN PATENT DOCUMENTS

| | | |
|---|---|---|
| CN | 102784496 A | 11/2012 |
| CN | 105283422 A | 1/2016 |
| JP | S58-58189 A | 4/1983 |
| JP | H11-77023 A | 3/1999 |
| JP | 2000-084368 A | 3/2000 |
| JP | 2000-317211 A | 11/2000 |
| JP | 2003-334433 A | 11/2003 |
| JP | 2007-268397 A | 10/2007 |
| JP | 2016-139766 A | 8/2016 |

OTHER PUBLICATIONS

Japan Patent Office, "Notice of Reasons for Refusal for Japanese Patent Application No. 2017-068092," dated Dec. 5, 2017.
China Patent Office, "Office Action for Chinese Patent Application No. 201780082241.7," dated Aug. 4, 2021.

* cited by examiner

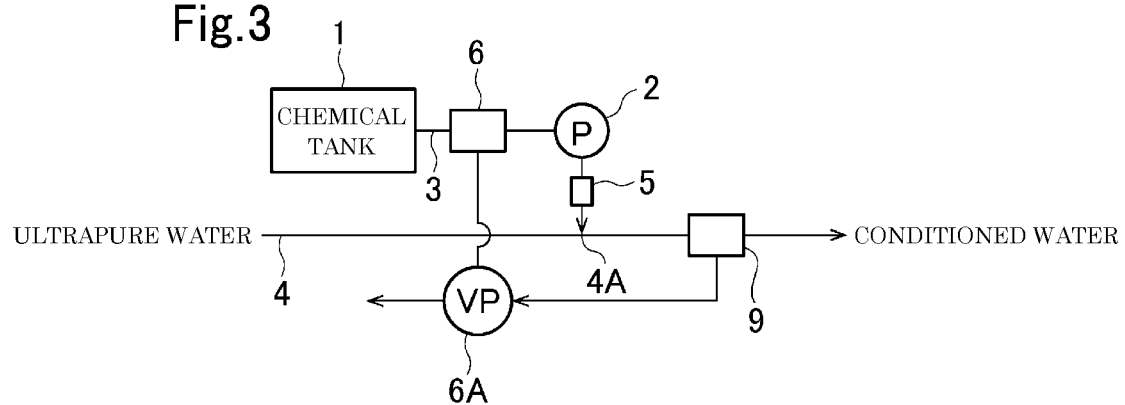
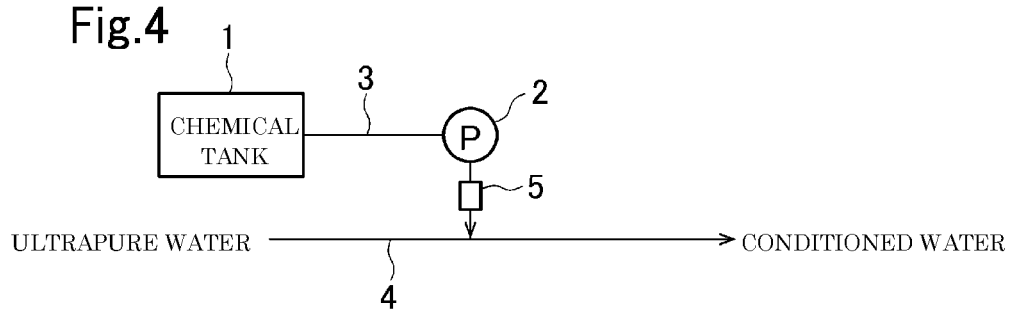

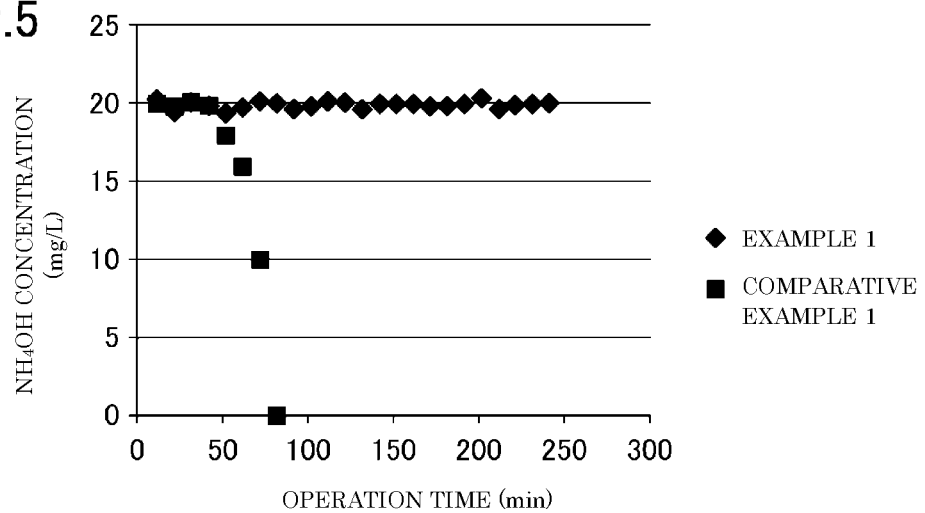

APPARATUS FOR PRODUCING CONDITIONED WATER

TECHNICAL FIELD

The present invention relates to an apparatus configured to produce conditioned water useful as wash water or the like for semiconductor wafers by adding a pH adjuster and/or a redox potential regulator to ultrapure water. The present invention relates to an apparatus configured to stably produce conditioned water with a low dissolved oxygen (DO) concentration while eliminating problems such as carry-in of DO from a chemical solution by a pH adjuster and/or a redox potential regulator and foaming.

BACKGROUND ART

In a step of washing and rinsing semiconductor wafers on which metals are exposed, conditioned water in which a pH adjuster such as an acid or alkali, or a redox potential regulator such as an oxidant or a reductant is dissolved in ultrapure water at the minimum necessary concentration that is very low may be used as wash water (including rinse water) in some cases, for suppressing charging of the wafers, corrosion or dissolution of the metals, and adhesion of fine particles (for example, PTL 1).

As a method for producing the wash water, a method in which a chemical solution in which a pH adjuster and/or a redox potential regulator is dissolved in water is injected is often employed because of its simple operation. Examples of the method for injecting a chemical solution include a method using a pump and a method using a closed container and compression of an inert gas such as $N_2$ therein, and both are practically used.

FIG. 4 is a systematic diagram showing a conventional apparatus for producing conditioned water. A chemical solution in a chemical tank 1 is injected by a chemical injection pump 2 into a water supply pipe 4 for ultrapure water via a chemical injection pipe 3. The reference numeral 5 represents a flow meter. The amount of the chemical solution to be injected into the ultrapure water supplied at a constant flow rate is controlled based on the values measured by the flow meter 5, thereby producing conditioned water with predetermined water quality.

If DO is contained in the ultrapure water into which the chemical solution is injected, problems such as oxidation of wafer materials during washing and rinsing occur. Therefore, ultrapure water for producing conditioned water is sufficiently degassed and thus generally has a DO concentration of less than 10 μg/L.

When a chemical solution of a pH adjuster, a redox potential regulator or the like is added to the ultrapure water, DO contained in the chemical solution is incorporated into the ultrapure water, and the DO concentration of conditioned water to be obtained becomes higher than the DO concentration of the ultrapure water.

Some chemical solutions are foamable, and there may be problems that the chemical injection pump is air-locked due to foaming, thereby making injection impossible, and the display of the flow meter used for controlling the amount of the chemical solution to be injected is wrong.

PTL 1: JP 2016-139766 A

SUMMARY OF INVENTION

It is an object of the present invention to provide an apparatus for producing conditioned water which solves problems such as incorporation of DO due to the chemical solution injected into ultrapure water, injection failure and measurement failure of the flow meter due to foaming of the chemical solution.

The inventor has found that the aforementioned problems can be solved by degassing the chemical solution using a degassing device immediately before injection into ultrapure water.

The gist of the present invention is as follows.

[1] An apparatus for producing conditioned water configured to add a pH adjuster and/or a redox potential regulator to ultrapure water to produce conditioned water, comprising: a chemical tank configured to store a chemical solution containing the pH adjuster and/or the redox potential regulator; a chemical injection pipe configured to inject the chemical solution in the chemical tank into the ultrapure water; and a degassing device configured to degas the chemical solution injected into the ultrapure water.

[2] The apparatus for producing conditioned water according to [1], wherein the degassing device is provided in the chemical injection pipe, and the chemical injection pipe comprises a chemical injection pump and a flow meter on the downstream side of the degassing device.

[3] The apparatus for producing conditioned water according to [1] or [2], comprising a return pipe configured to return part of the chemical solution degassed by the degassing device to the chemical tank.

[4] The apparatus for producing conditioned water according to any one of [1] to [3], wherein the chemical solution contains hydrochloric acid, acetic acid, nitric acid, phosphoric acid, sulfuric acid, hydrofluoric acid, ammonia, sodium hydroxide, potassium hydroxide, tetramethylammonium hydroxide, or ammonium carbonate as the pH adjuster.

[5] The apparatus for producing conditioned water according to any one of [1] to [4], wherein the chemical solution contains hydrogen peroxide or nitric acid as the redox potential regulator.

[6] The apparatus for producing conditioned water according to any one of [1] to [5], wherein the conditioned water is wash water or rinse water for semiconductor wafers.

[7] The apparatus for producing conditioned water according to any one of [1] to [6], comprising: a water supply pipe configured to supply the ultrapure water to a use place, wherein the chemical injection pipe is connected to the water supply pipe.

Advantageous Effects of Invention

When adding a pH adjuster and/or a redox potential regulator into ultrapure water to produce conditioned water useful as wash water or the like for semiconductor wafers, the present invention can solve the problems such as incorporation of DO from the chemical solution, injection failure and measurement failure of the flow meter due to foaming of the chemical solution, thereby enabling stable production of conditioned water with a low DO concentration and high water quality.

BRIEF DESCRIPTION OF DRAWINGS

FIG. 3 is a systematic diagram showing still another example of the embodiments of the apparatus for producing conditioned water of the present invention.

FIG. 4 is a systematic diagram showing a conventional apparatus for producing conditioned water.

FIG. 5 is a graph showing time-dependent changes in $NH_4OH$ concentration in conditioned water obtained in Example 1 and Comparative Example 1.

DESCRIPTION OF EMBODIMENTS

Hereinafter, the present invention will be described in detail with reference to the drawings.

Figure 1:
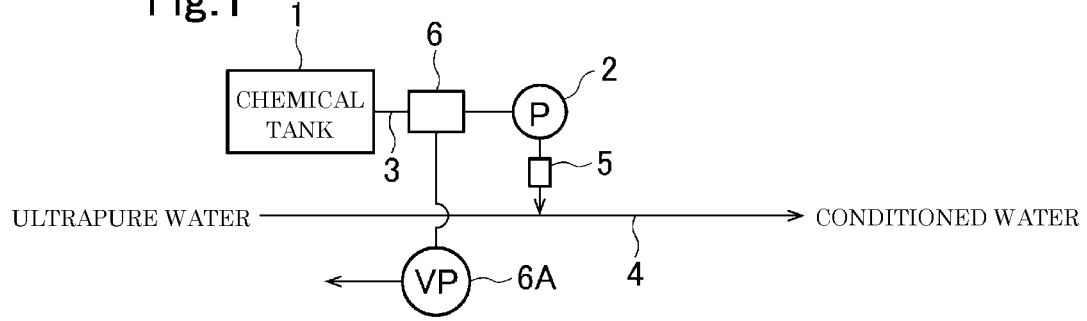
FIG. 1 is a systematic diagram showing an example of the embodiments of the apparatus for producing conditioned water of the present invention.
Figure 2:
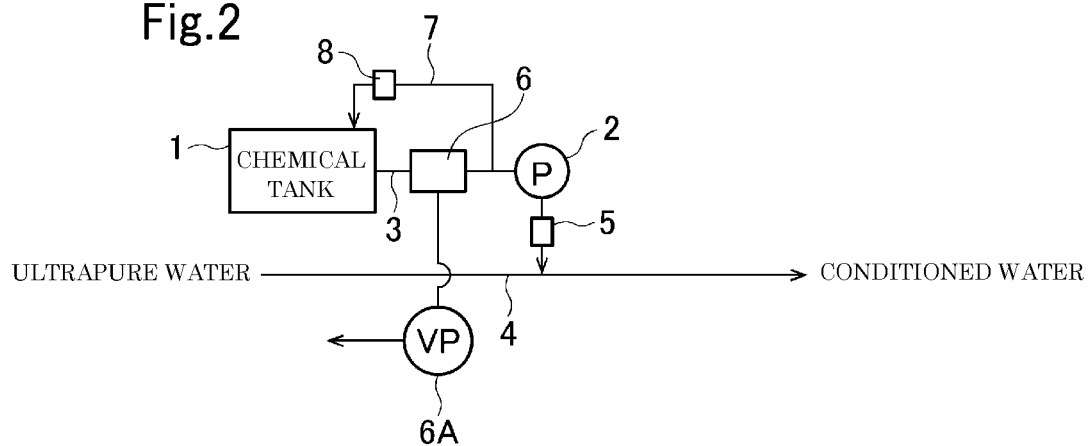
FIG. 2 is a systematic diagram showing another example of the embodiments of the apparatus for producing conditioned water of the present invention.

FIGS. 1 to 3 are systematic diagrams showing examples of the embodiments of the apparatus for producing conditioned water of the present invention. In FIGS. 1 to 3, members having the same functions as those of the members shown in FIG. 4 are denoted by the same reference numerals.

The apparatus for producing conditioned water of the present invention configured to add a pH adjuster and/or a redox potential regulator to ultrapure water to produce conditioned water includes: a chemical tank 1 configured to store a chemical solution containing the pH adjuster and/or the redox potential regulator; a chemical injection pipe 3 configured to inject the chemical solution in the chemical tank 1 into the ultrapure water; and a degassing device 6 configured to degas the chemical solution injected into the ultrapure water. The chemical solution from the chemical tank 1 with a flow rate adjusted by a chemical injection pump 2 and a flow meter 5 is generally injected into a water supply pipe 4 configured to supply ultrapure water at a constant flow rate.

In the apparatus for producing conditioned water in FIGS. 1 to 3, the degassing device 6 is provided on the upstream side of the chemical injection pump 2 of the chemical injection pipe 3. The chemical solution in the chemical tank 1 after being degassed by the degassing device 6 is injected into the water supply pipe 4 for ultrapure water via the chemical injection pump 2 and the flow meter 5.

Providing the degassing device 6 so that the chemical injection pump 2 and the flow meter 5 are located on the downstream side of the degassing device 6 in the chemical injection pipe 3 can prevent air lock of the chemical injection pump 2 and malfunction of the flow meter 5 due to foaming of the chemical solution, while removing DO in the chemical solution.

In FIGS. 1 to 3, a membrane degassing device which is partitioned by a gas permeable membrane into the liquid phase side and the vapor phase side to eliminate gases dissolved in the chemical solution passed into the liquid phase side by vacuuming the vapor phase side using an ejector or a vacuum pump 6A is provided as the degassing device 6. The degassing device is not limited to the membrane degassing device at all.

The degree of degassing by the degassing device may be such that a chemical solution with a low DO concentration satisfying the DO concentration required for conditioned water can be obtained.

FIG. 2 shows an example provided with a return pipe 7 configured to return part of the chemical solution degassed by the degassing device 6 to the chemical tank 1. Returning part of the degassed solution to the chemical tank 1 can reduce the DO concentration in the chemical solution in the chemical tank 1 and can suppress bubble formation in the chemical solution in the chemical tank 1.

The amount of the degassed solution to be returned to the chemical tank 1 by the return pipe 7 is not particularly limited but is generally preferably about 30 to 50% of the degassed solution, for obtaining the aforementioned effect by returning without significantly reducing the processing efficiency.

In the case of returning part of the degassed solution to the chemical tank 1, the return pipe 7 may be provided with a filter 8 to remove impurities in the chemical solution.

The apparatus in FIG. 3 is provided with a degassing device 9 on the downstream side of an injection point 4A in the water supply pipe 4 for ultrapure water. Providing the degassing device 9 on the downstream side of the injection point 4A enables conditioned water with a low DO concentration to be produced even in the case where ultrapure water with a high DO concentration, for example, ultrapure water with a DO concentration of 10 μg/L or more is supplied to the water supply pipe 4. The degassing device 9 can reduce the number of members by sharing a vacuuming device with the degassing device 6. In the case of providing the degassing device 9 on the downstream side of the injection point 4A, a large degassing device is required. Therefore, in the case of ultrapure water with a low DO concentration, the degassing device 9 is preferably omitted.

In the present invention, the chemical solution injected into ultrapure water is a chemical solution prepared by dissolving a pH adjuster and/or a redox potential regulator in ultrapure water.

Examples of the pH adjuster include hydrochloric acid, acetic acid, nitric acid, phosphoric acid, sulfuric acid, hydrofluoric acid, ammonia, sodium hydroxide, potassium hydroxide, tetramethylammonium hydroxide, and ammonium carbonate.

Examples of the redox potential regulator include hydrogen peroxide and nitric acid.

The chemical solution used in the present invention generally contains these agents at a concentration of about 20 to 48 wt %. Generally, conditioned water with a concentration of the agents of about 0.1 to 100 mg/L is produced by injecting such a chemical solution into ultrapure water.

The ultrapure water to which the chemical solution is added preferably has a low DO concentration, and ultrapure water with a low DO concentration such as a DO concentration of less than 10 μg/L, preferably less than 1 μg/L, is generally used. It is also possible to use ultrapure water with a DO concentration of 10 μg/L or more by providing a degassing device in the water supply pipe for ultrapure water, as in FIG. 3.

The present invention is effective in the case of producing conditioned water with a low DO concentration such as a DO concentration of 10 μg/L or less, particularly less than 1 μg/L, by injecting the aforementioned chemical solution into ultrapure water.

Although conditioned water produced by the present invention is useful as wash water or rinse water for semiconductor wafers, there is no limitation to these applications. The conditioned water can be used effectively for applications which require conditioned water with a low DO concentration.

EXAMPLES

Hereinafter, the present invention will be more specifically described by way of Examples.

Example 1

Conditioned water was produced under the following conditions using the apparatus for producing conditioned water of the present invention having the configuration shown in FIG. 1.

DO concentration in ultrapure water: Less than 1 μg/L

Flow rate of ultrapure water: 40 L/min

Chemical solution: 1.0-wt % NH$_4$OH aqueous solution (which was purposely foamed by stirring)

Amount of chemical solution injected: 80 m L/min

Target NH$_4$OH concentration in conditioned water: 20 mg/L

A membrane degassing device (Liqui-Cel) incorporating a 10-inch degassing membrane was used as a degassing device, and a vacuum pump was used for degassing.

As a result, the DO concentration in the conditioned water obtained was less than 1 μg/L, and the DO concentration in ultrapure water used for producing the conditioned water did not increase.

Further, time-dependent changes in NH$_4$OH concentration in the conditioned water obtained were as shown in FIG. 5, and the NH$_4$OH concentration in the conditioned water was stable at the target value, 20 mg/L, over 240 minutes.

Comparative Example 1

Conditioned water was produced under the same conditions as in Example 1 except that a conventional apparatus without degassing devices shown in FIG. 4 was used.

As a result, the DO concentration in the conditioned water obtained was 16 μg/L, which was considerably higher than the DO concentration in ultrapure water.

Further, time-dependent changes in NH$_4$OH concentration in the conditioned water obtained were as shown in FIG. 5. The NH$_4$OH concentration started to decrease from 50 minutes after the start of operation, and the NH$_4$OH concentration became unmeasurable at 80 minutes after the start of operation. This was because air started to accumulate in a diaphragm portion of the chemical injection pump, finally resulting in an air-locked state.

Although the present invention has been described in detail using specific embodiments, it will be apparent to those skilled in the art that various modifications are possible without departing from the spirit and scope of the invention.

This application is based on Japanese Patent Application No. 2017-068092 filed on Mar. 30, 2017, which is incorporated by reference in its entirety.

REFERENCE SIGNS LIST

1: Chemical tank
2: Chemical injection pump
5: Flow meter
6, 9: Degassing device

The invention claimed is:

1. An apparatus for producing conditioned water configured to add a pH adjuster and/or a redox potential regulator to ultrapure water to produce conditioned water, comprising:
   a chemical tank configured to store a chemical solution containing the pH adjuster and/or the redox potential regulator;
   a chemical injection pipe configured to inject the chemical solution in the chemical tank into the ultrapure water;
   a degassing device configured to degas the chemical solution injected into the ultrapure water, and
   a return pipe configured to return part of the chemical solution degassed by the degassing device to the chemical tank.

2. The apparatus for producing conditioned water according to claim 1, wherein
   the degassing device is provided in the chemical injection pipe, and
   the chemical injection pipe comprises a chemical injection pump and a flow meter on a downstream side of the degassing device.

3. The apparatus for producing conditioned water according to claim 1, wherein
   the chemical tank is configured to store the chemical solution containing the pH adjuster and the pH adjuster is hydrochloric acid, acetic acid, nitric acid, phosphoric acid, sulfuric acid, hydrofluoric acid, ammonia, sodium hydroxide, potassium hydroxide, tetramethylammonium hydroxide, or ammonium carbonate.

4. The apparatus for producing conditioned water according to claim 1, wherein
   the chemical tank is configured to store the chemical solution containing the redox potential regulator and the redox potential regulator is hydrogen peroxide or nitric acid.

5. The apparatus for producing conditioned water according to claim 1, wherein
   the apparatus is configured to produce the conditioned water, so as to be useful as wash water or rinse water for semiconductor wafers.

6. The apparatus for producing conditioned water according to claim 1, further comprising:
   a water supply pipe configured to supply the ultrapure water to a use place, wherein
   the chemical injection pipe is connected to the water supply pipe.

7. An apparatus for producing conditioned water configured to add a pH adjuster and/or a redox potential regulator to ultrapure water to produce conditioned water, comprising:
   a chemical tank configured to store a chemical solution containing the pH adjuster and/or the redox potential regulator;
   a chemical injection pipe attached to the chemical tank and configured to inject the chemical solution in the chemical tank into the ultrapure water; and
   a degassing device attached to the chemical injection pipe and configured to degas the chemical solution injected into the ultrapure water,
   wherein the chemical injection pipe includes a chemical injection pump and a flow meter on a downstream side of the degassing device.

8. An apparatus for producing conditioned water configured to add a pH adjuster and/or a redox potential regulator to ultrapure water to produce conditioned water, comprising:
   a chemical tank configured to store a chemical solution containing the pH adjuster and/or
   the redox potential regulator;
   a water supply pipe through which the ultrapure water flows;
   a chemical injection pipe arranged between the chemical tank and the water supply pipe, and configured to inject the chemical solution in the chemical tank into the water supply pipe;
   a degassing device disposed in the chemical injection pipe and configured to degas the chemical solution injected into the ultrapure water; and
   another degassing device disposed in the water supply pipe on a downstream side of a point where the chemical injection pipe is attached to the water supply pipe, configured to adjust dissolved oxygen in the ultrapure water.

\* \* \* \* \*